United States Patent [19]
Kim

[11] Patent Number: 6,154,417
[45] Date of Patent: Nov. 28, 2000

[54] INTEGRATED CIRCUIT MEMORY DEVICES HAVING SYNCHRONOUS WAVE PIPELINING CAPABILITY AND METHODS OF OPERATING SAME

[75] Inventor: Nam-Jong Kim, Kyunggi-do, Rep. of Korea

[73] Assignee: Samsung Electronics Co., Ltd., Rep. of Korea

[21] Appl. No.: 09/436,938

[22] Filed: Nov. 8, 1999

[30] Foreign Application Priority Data

Nov. 26, 1998 [KR] Rep. of Korea ......................... 98-51012

[51] Int. Cl.[7] ....................................... G11C 8/00
[52] U.S. Cl. ................. 365/233; 365/189.04; 365/230.03
[58] Field of Search .............................. 365/233, 230.03, 365/239, 189.05, 230.06, 230.08, 194, 189.04

[56] References Cited

U.S. PATENT DOCUMENTS

| | | | |
|---|---|---|---|
| 5,581,512 | 12/1996 | Kitamura | 365/233 |
| 5,592,434 | 1/1997 | Iwamoto et al. | 365/233 |
| 5,812,489 | 9/1998 | Matsui | 365/233 |
| 5,815,462 | 9/1998 | Konishi et al. | 365/233 |
| 5,892,730 | 4/1999 | Sato et al. | 365/233 |
| 5,895,482 | 4/1999 | Toda | 711/104 |

*Primary Examiner*—David Nelms
*Assistant Examiner*—Thong Le
*Attorney, Agent, or Firm*—Myers Bigel Sibley & Sajovec

[57] ABSTRACT

Integrated circuit memory devices having synchronous wave pipelining capability include a memory cell array and circuitry therein that is electrically coupled to the memory cell array and latches read data accessed from the memory cell array during a prior ith cycle of an internal clock signal (PCLK), in-sync with an i+1th cycle of the internal clock signal. This delayed latching of previously accessed read data increases the data latch margin and improves device reliability even if worst case processing conditions are encountered. This latching circuit includes a register that is responsive to a plurality of register input control signals (DLLi) and a pipelined register input control circuit that generates the plurality of register input control signals in response to a column select disable signal (CSLD). The latching circuit also preferably includes a column select control circuit that latches a value of a bank select signal (CAi_BANK) when the internal clock signal is in a first logic state and passes the latched value of the bank select signal as the column select disable signal upon transition of the internal clock signal from the first logic state to a second logic state.

17 Claims, 10 Drawing Sheets

INTEGRATED CIRCUIT MEMORY DEVICES HAVING SYNCHRONOUS WAVE PIPELINING CAPABILITY AND METHODS OF OPERATING SAME

RELATED APPLICAION

This application is related to Korean Application No. 98-51012, filed Nov. 26, 1998, the disclosure of which is hereby incorporated herein by reference.

FIELD OF THE INVENTION

The present invention relates to integrated circuit devices, and more particularly to integrated circuit memory devices and methods of operating same.

BACKGROUND OF THE INVENTION

As the capacity of semiconductor memory devices increases, the sizes of chips on which the devices are formed also becomes larger to accommodate the larger devices. In addition, as the sizes of the chips increases, the length of data lines or data paths for transferring data therein also typically becomes larger. Such increases in data line and data path length may result in increased wiring resistance and reduce the maximum frequency at which memory devices may reliably operate.

Techniques to improve operating speed include wave pipelining techniques. An exemplary wave pipelining technique is disclosed in article by D. Wong et al., entitled "WP3.6: A Bipolar Population Counter Using Wave-Pipelining to Achieve 2.5× Normal Clock Frequency", IEEE International Solid-State Circuit Conference (ISSCC) Digest of Technical Papers, pp. 56–57, February (1992). Another wave pipelining technique is disclosed in U.S. Pat. No. 5,703,815 to Kuhara et al. entitled "High-Speed Semiconductor Memory System". In particular, the Kuhara et al. patent discloses a technique to enhance the wave-pipeline operational frequency of a memory system by reducing cycle time. The cycle time is reduced by reducing a difference in the signal delay time caused by differences in data path lengths. According to Kuhara et al., the difference in signal delay time can be reduced by inserting a delay circuit into a signal path having a smaller delay time between an address input section and a data output section. A wave pipelining technique is also disclosed in an article by Hoi-Jun Yoo et al., entitled "A 150 MHz 8-Banks 256M Synchronous DRAM with Wave Pipelining Methods", IEEE International Solid-State Circuit Conference Digest of Technical Papers, paper FA 14.4, pp. 250–251 (1995).

Figure 1:
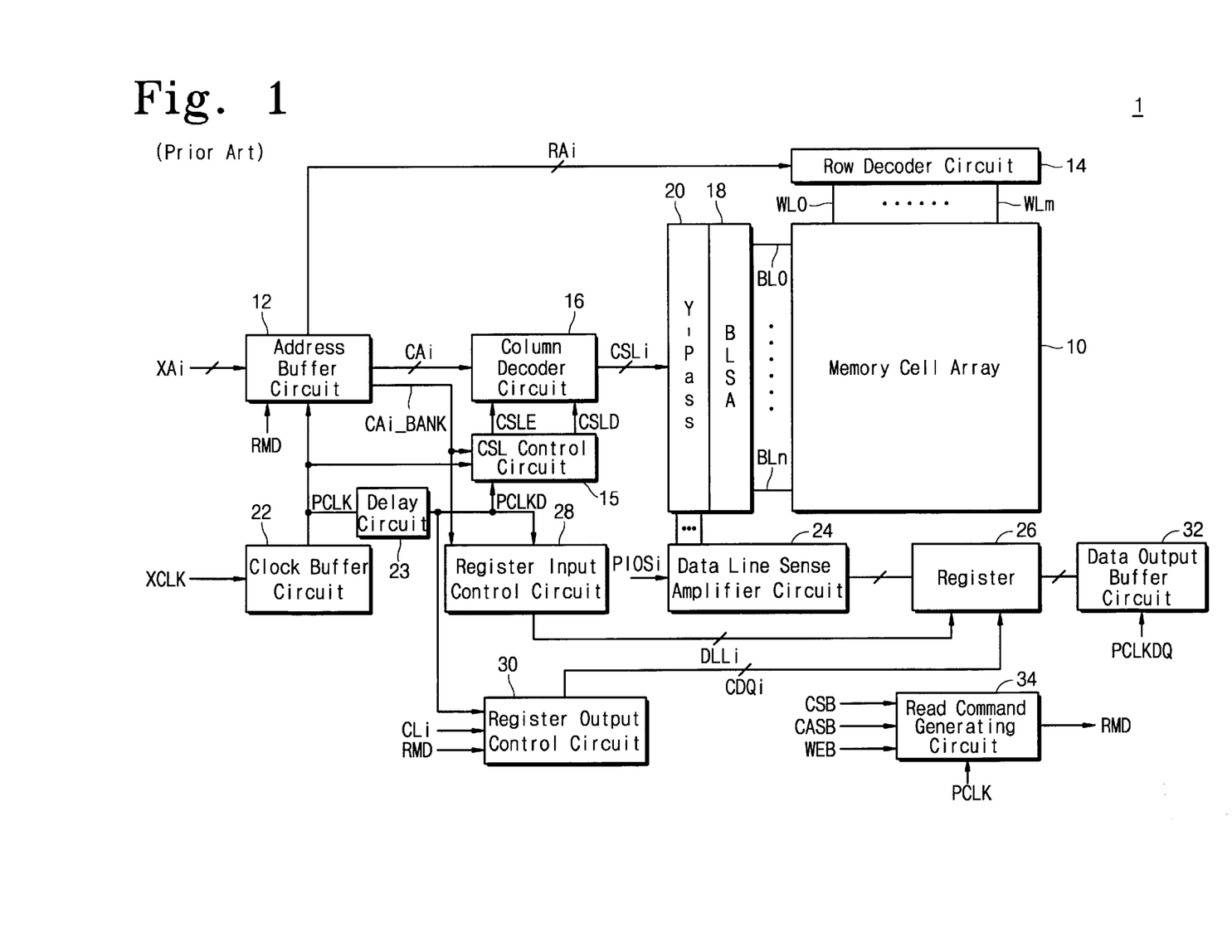
FIG. 1 is a block diagram of an integrated circuit memory device according to the prior art.

Referring now to FIGS. 1–4, an integrated circuit memory device that utilizes wave pipelining is disclosed. In particular, FIG. 1 illustrates a memory device 1 (e.g., DRAM device) having a memory cell array 10 therein. A row decoder circuit 14 is electrically coupled to the memory cell array 10 by a plurality of word lines WL0–WLm. The row decoder circuit 14 receives row addresses RAi from an address buffer circuit 12. The address buffer circuit 12 receives an external address XAi and is responsive to a read command RMD and an internal clock signal PCLK. The internal clock signal PCLK is generated by a clock buffer circuit 22 that is responsive to an external clock signal XCLK. The address buffer circuit 12 also generates column addresses CAi and a bank select signal CAi_BANK. The column addresses CAi are provided to a column decoder circuit 16. The column decoder circuit 16 generates column select signals CSLi and is responsive to a column select enable signal CSLE and a column select disable signal CSLD. The column select enable signal CSLE and the column select disable signal CSLD are generated by a CSL control circuit 15. This CSL control circuit 15 is responsive to the internal clock signal PCLK, the bank select signal CAi_BANK and a delayed version of the internal clock signal PCLKD.

The column select signals CSLi are provided to a column pass gate circuit 20, as illustrated. The column pass gate circuit 20 is electrically coupled to the memory cell array 10 by a bit line sense amplifier circuit 18. As will be understood by those skilled in the art, the bit line sense amplifier circuit 18 senses and amplifies data signals that are generated on a plurality of bit lines BL0–BLn during reading operations. The column pass gate circuit 20 also passes "read" data to a data line sense amplifier circuit 24. The data line sense amplifier circuit 24 passes the "read" data to an output register 26 in response to an I/O control signal PIOSi.

The memory device 1 of FIG. 1 supports burst mode operation. Accordingly, the column address signals CAi that are applied to the column decoder circuit 16 can serve as initial column addresses. Although not shown, a burst counter and a burst address generator can be used to generate a plurality of consecutive column addresses (i.e., burst column addresses) in response to the initial column address. The number of consecutive burst column addresses that are generated is typically a function of a preselected burst length (BL). These burst column addresses are then decoded in order by the column decoder circuit 16 as respective column select signals CSLi.

Figure 3:
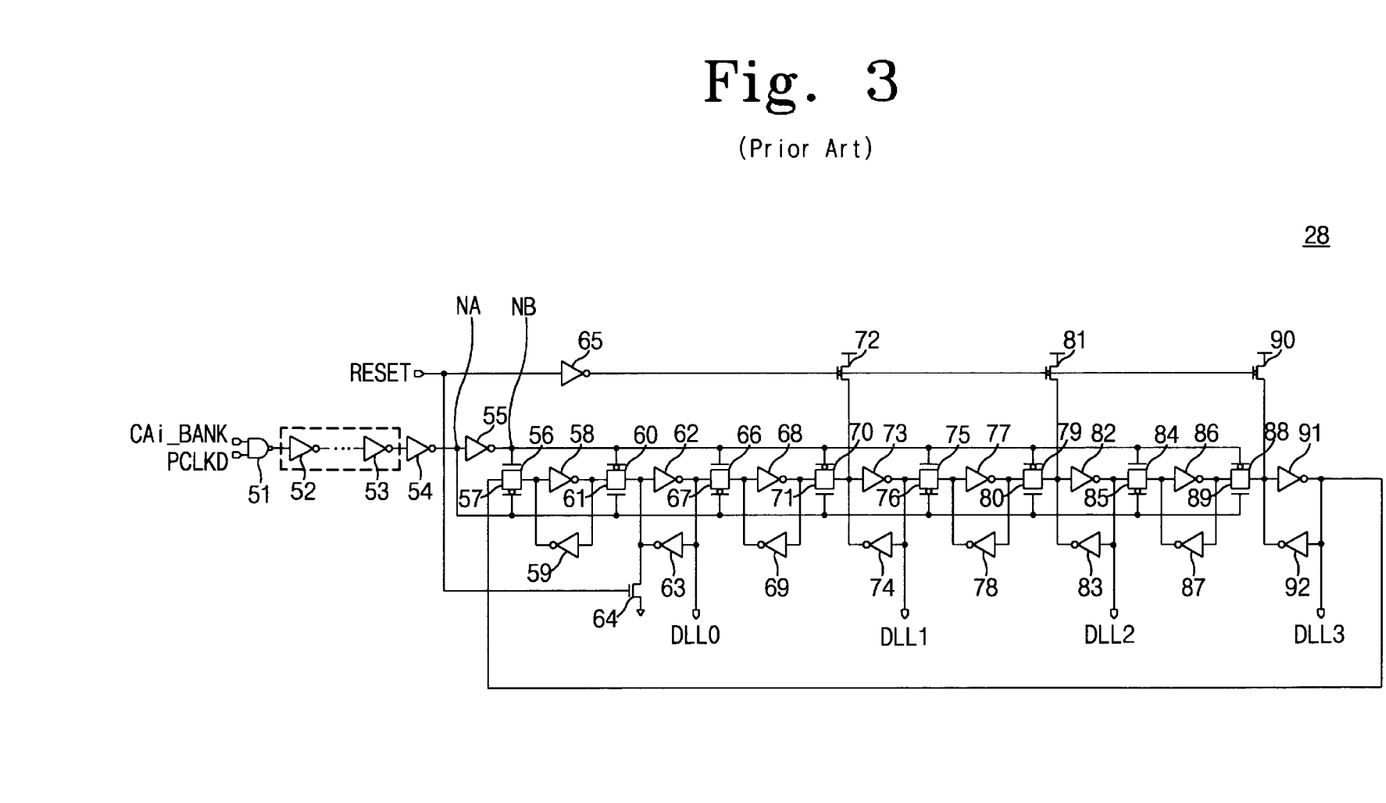
FIG. 3 is an electrical schematic of a register input control circuit, according to the device of FIG. 1.

Referring still to FIG. 1, the output register 26 latches data (e.g., read data) provided by the data line sense amplifier circuit 24, and is responsive to register input control signals DLLi and register output control signals CDQi. The register input control signals DLLi are generated in sequence by a register input control circuit 28. The register input control circuit 28, which is illustrated in detail by FIG. 3, is responsive to the bank select signal CAi_BANK and the delayed internal clock signal PCLKD. The register output control signals CDQi are generated by a register output control circuit 30. The register output control circuit 30 is responsive to the delayed internal clock signal PCLKD, the read command RMD and signal CLi. A read command generating circuit 34 generates the read command RMD in-sync with the internal clock signal PCLK and in response to a write enable signal WEB, a column address strobe signal CASB and a chip select signal CSB.

Figure 2:
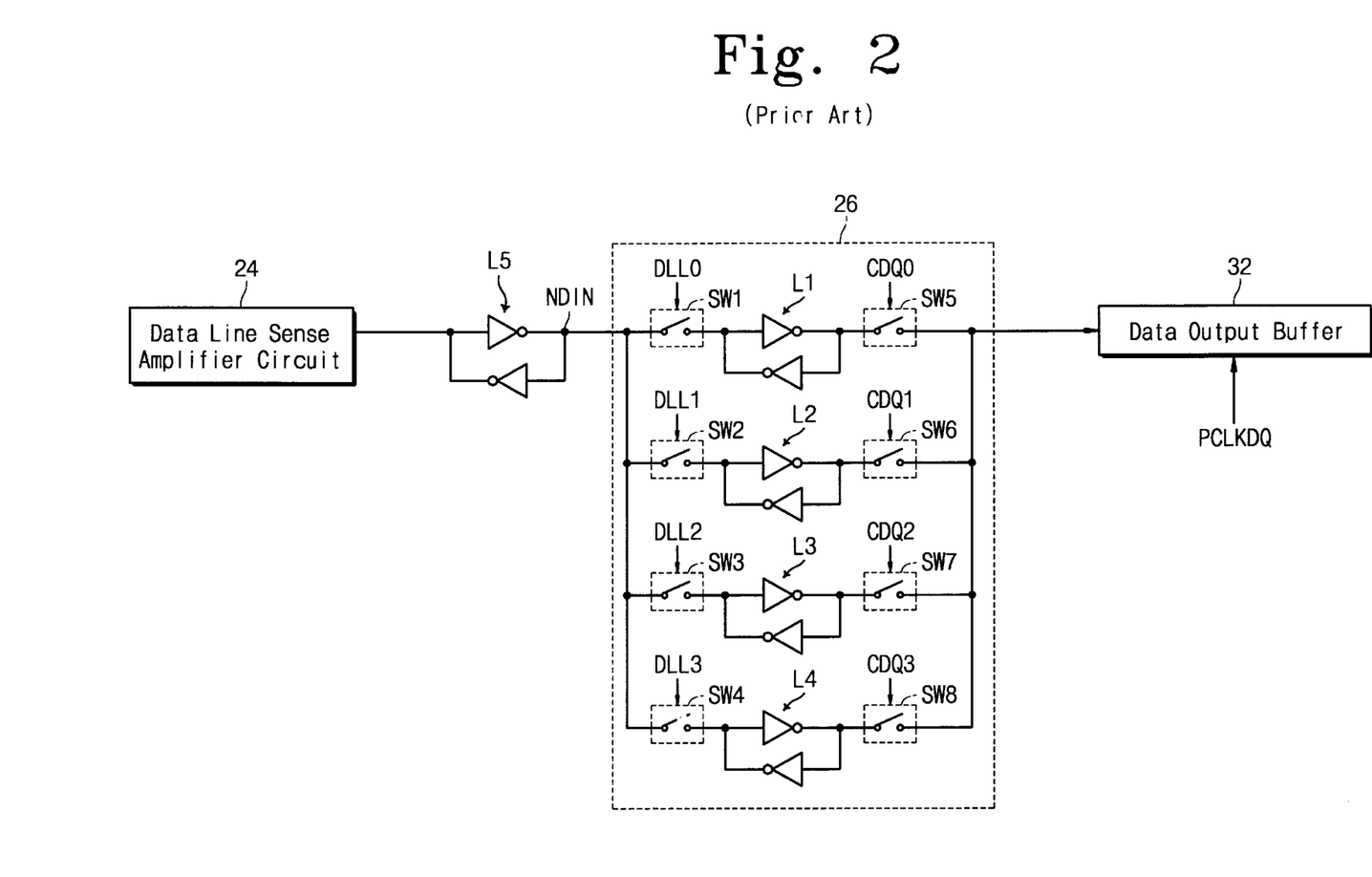
FIG. 2 is an electrical schematic of a data output register, according to the device of FIG. 1.

An exemplary output register 26 is illustrated by FIG. 2. This register 26 includes a plurality of latch units L1–L4. A plurality of input switches SW1–SE4 are also provided so that read data at node NDIN can be loaded into each latch unit. Latch unit L5 is provided to prevent node NDIN from floating. The switches are responsive to the register input control signals DLLi. The switches may comprise CMOS transmission gates or NMOS transistors, for example. A plurality of output switches SW5–SW8 are also provided so that data stored by latch units L1–L4 can be passed sequentially to a data output buffer 32 that is responsive to signal PCLKDQ. As will be understood by those skilled into the art, a plurality of bits of serial data (e.g., 4 bits) may be provided by the data line sense amplifier circuit 24 and these serial data bits may be loaded in sequence into each of the parallel latch units L1–L4 by sequencing signals DLL0–DLL3 through the following pattern: 1000, 0100, 0010, 0001. A similar pattern for the output signals CDQ1–CDQ4 may also be used to pass the latched data in a serial fashion to the output buffer 32.

Referring now to FIG. 3, a conventional register input control circuit 28 is illustrated. This control circuit 28 is responsive to the delayed clock signal PCLKD and the bank select signal CAi_BANK. In particular, both the delayed clock signal PCLKD and bank select signal CAi_BANK are provided as inputs to a two-input NAND gate 51. The output of the NAND gate 51 is provided to a delay circuit comprising an even number of inverters (e.g., inverter 52 at the input and inverter 53 at the output). As will be understood by those skilled in the art, the signal at the output of inverter 54 at node NA will represent a delayed version of the delayed clock signal PCLKD once the bank select signal CAi_BANK has been set to a logic 1 level. Thus, the signal at node NA (input to inverter 55) will be in-sync with the delayed clock signal PCLKD and each 0→1 transition of the delayed clock signal PCLKD will translate into a 0→1 transition at node NA and a 1→0 transition at node NB (the output of inverter 55). Moreover, after the outputs DLL0–DLL3 of the register input control circuit 28 have been reset to the state "1000" by driving the reset signal RESET to a logic 1 level, each 0→1 transition at node NA will cause the state of the outputs DLL0–DLL3 to transition one step in the cyclical sequence 1000→0100→0010→0001→ . . . As illustrated, a 0→1 transition on the RESET signal line will cause the output of inverter 65 to transition to a logic 0 level. When this occurs, PMOS pull-up transistors. 72, 81 and 90 will turn on and drive outputs DLL1, DLL2 and DLL3 to logic 0 levels. NMOS pull-down transistor 64 will also turn on and drive output DLL0 to a logic 1 level.

Figure 4:
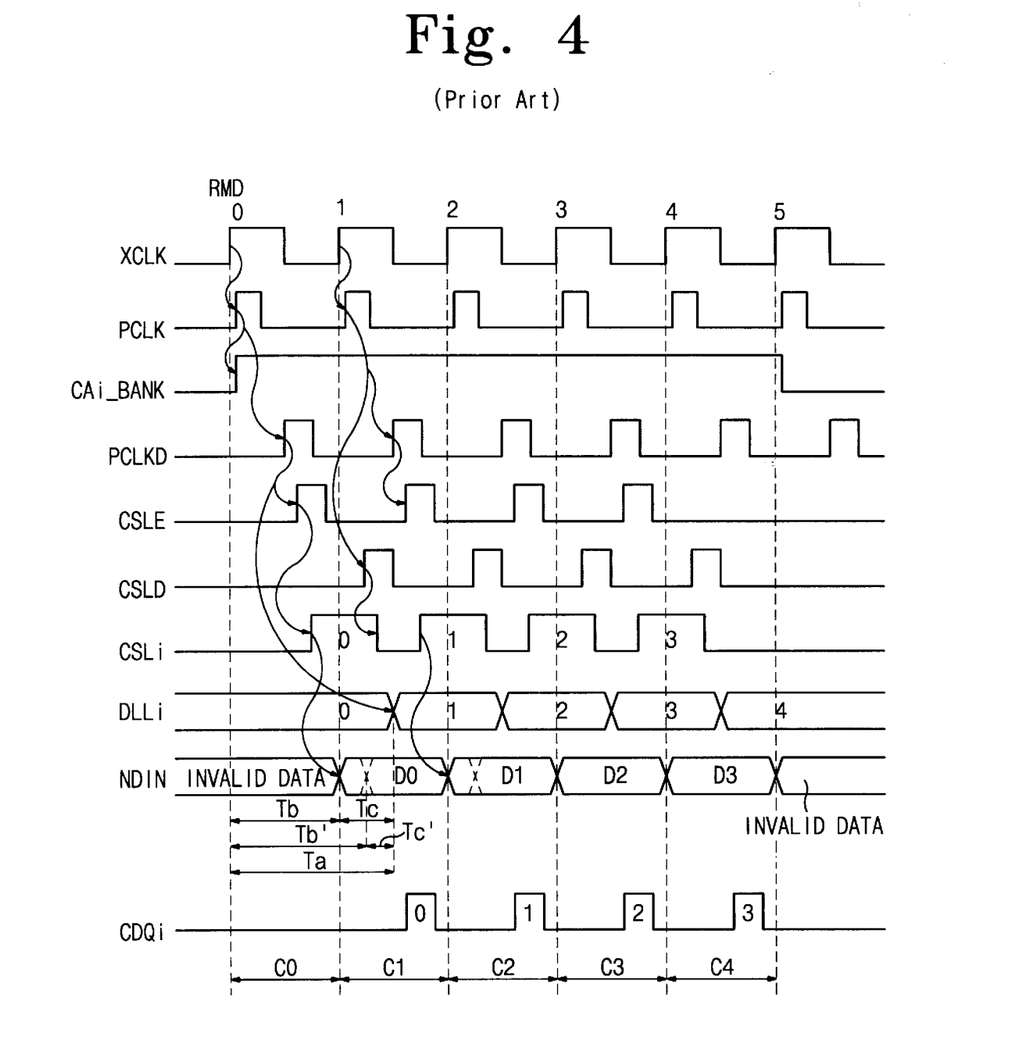
FIG. 4 is a timing diagram which illustrates operation of the memory device of FIG. 1.

FIG. 4 is a timing diagram that illustrates operation of the memory device of FIGS. 1–3. In particular, FIG. 4 is a timing diagram that illustrates a burst read operation using a conventional wave pipeline method. The timing diagram corresponds to a device having a CASB latency of 2 and a burst length of 4. As illustrated, each leading edge of an external clock signal XCLK triggers a pulse of an internal clock signal PCLK having the same period. The delay circuit 23 also generates the delayed clock signal PCLKD as a delayed version of the internal clock signal PCLK. Thus, each pulse of the delayed clock signal PCLKD is in-sync with a respective pulse of the internal clock signal PCLK. The column select enable signal CSLE and the column select disable signal CSLD are also generated in-sync with the internal clock signal PCLK. A rising edge of the column select enable signal CSLE results in a rising 0→1 transition of the column select signal CSLi and a rising edge of the column select disable signal CSLD results in a falling 1→0 transition of the column select signal CSLi. As will be understood by those skilled in the art, a rising edge of the column select signal CSLi initiates a transfer of read data out of the memory cell array 10 during a reading operation. This read data is passed through the bit line sense amplifier circuit 18, the column pass gate circuit 20 and the data line sense amplifier circuit 24, to node NDIN of the output register 26. In particular, the delays associated with the read data path may be such that node NDIN receives the first bit of read data D0 at the commencement of clock interval C1 (i.e., after a time interval of Tb, as measured from a rising edge of the external clock signal XCLK), as illustrated by FIG. 4. The output signals DLL0–DLL3 from the register input control circuit 28 are also set to transition at time points that are intermediate the first, second, third and fourth clock intervals C1–C4. For example, the transition of output signal DLL0 from 1→0 during the first clock cycle C1 is in-sync with a transition of PCLK and PCLKD during the zeroth clock cycle C0. As illustrated, the transition of output DLL0 from 1→0 takes place after a time interval Ta, as measured from a rising edge of the external clock signal XCLK.

Accordingly, the time interval Tc represents the period of time during which read data at node NDIN can be successfully latched into the register (e.g., latch L1). This period of time is typically referred to as the "data latch margin". Data that has been successfully latched may then be passed to the output buffer in-sync with the register output control signals CDQi. Unfortunately, because the time interval Tb may be influenced significantly by changes to the parameters associated with the memory cell array 10, and because the fabrication design rules associated with the memory array and closely related circuits are typically much more stringent than the design rules associated with other peripheral circuits (e.g., delay circuit 23, register input control circuit 28 and register 26, for example), relatively slight variations in process conditions during fabrication may cause the time interval Tb to increase in duration without a concomitant increase in the duration of time interval Ta. For example, variations in process conditions may cause the data D0 to become valid after time interval Tb' instead of time interval Tb. In such cases, the data latch margin may decrease to value equal to Tc'. If the value of Tc' decreases to zero or becomes negative, data read failures likely will occur. To correct such failures, the operating speed of a DRAM device having a multi-stage pipeline may be reduced. Unfortunately, the operating speed of DRAM devices having a single-stage pipeline typically cannot be reduced to correct such failures.

Thus, notwithstanding the above-described memory devices, there continues to be a need for memory devices that have higher operating reliability and are less susceptible to failure in response to process variations that occur during fabrication.

SUMMARY OF THE INVENTION

It is therefore an object of the present invention to provide improved synchronous integrated circuit memory devices and methods of operating same.

It is another object of the present invention to provide synchronous integrated circuit memory devices that have higher operating reliability and are less likely to fail in response to process variations that occur during fabrication.

These and other objects, advantages and features of the present invention are provided by integrated circuit memory devices that include a memory cell array and circuitry therein that is electrically coupled to the memory cell array and latches read data accessed from the memory cell array during a prior ith cycle of an internal clock signal (PCLK), in-sync with an i+1th cycle of the internal clock signal. This delayed latching of previously accessed read data increases the data latch margin and improves device reliability even if worst case processing conditions are encountered. According to one embodiment of the present invention, this latching circuit includes a register that is responsive to a plurality of register input control signals (DLLi) and a pipelined register input control circuit that generates the plurality of register input control signals in response to a column select disable signal (CSLD). The latching circuit also preferably includes a column select control circuit that latches a value of a bank select signal (CAi_BANK) when the internal clock signal is in a first logic state and passes the latched value of the bank select signal as the column select disable signal upon transition of the internal clock signal from the first logic state to a second logic state.

According to another embodiment of the present invention, the latching circuitry may also include a register that is responsive to a plurality of register input control signals (DLLi) and a pipelined register input control circuit that generates the plurality of register input control signals in response to a dual-delayed clock signal (PCLKDD). In this embodiment, a delay circuit is also provided that latches a value of a read command signal (RMD) when a delayed version of the internal clock signal is in a first logic state and passes the latched value of the read command signal as the dual-delayed clock signal upon transition of the delayed version of the internal clock signal from the first logic state to a second logic state.

According to yet another embodiment of the present invention, a preferred synchronous memory device comprises a data output register that is responsive to i through j consecutive register input control signals (DLLi) and i through j register output control signals (CDQi). A column decoder circuit is also provided to generate i through j column select signals in sequence during respective i through j consecutive periods of an internal clock signal. Circuitry is also provided that is responsive to the i through j column select signals. This circuitry provides read data to the data output register during i+α through j+α consecutive periods of the internal clock signal, where α is a positive integer. In addition, a pipelined register input control circuit is provided that generates the i through j consecutive register input control signals in-sync with the internal clock signal during the i+α through j+α consecutive periods thereof.

DESCRIPTION OF PREFERRED EMBODIMENTS

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. Like numbers refer to like elements throughout and signal lines and signals thereon may be referred to by the same reference symbols.

Figure 5:
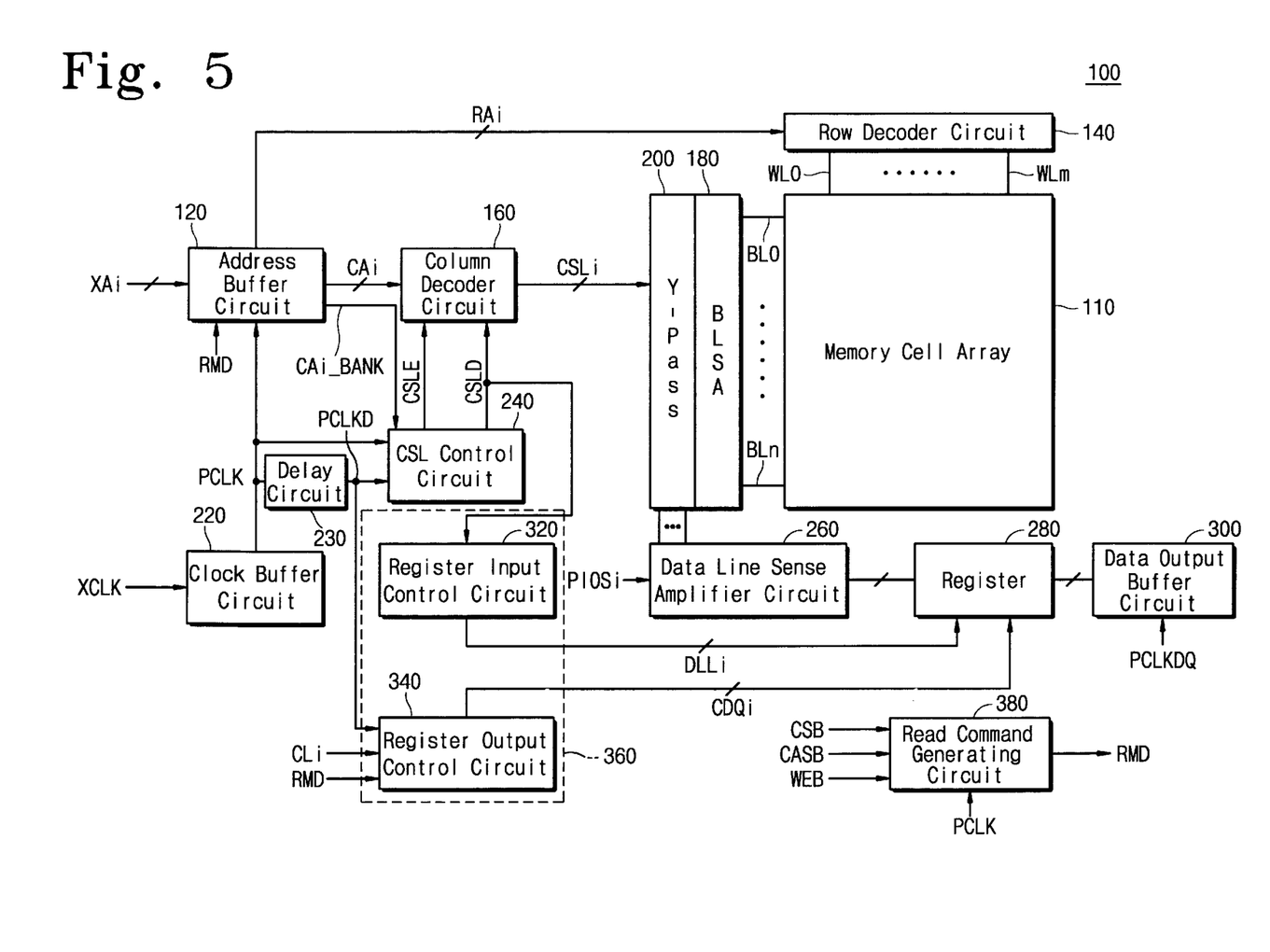
FIG. 5 is a block diagram of a memory device according to a first embodiment of the present invention.
Figure 8:
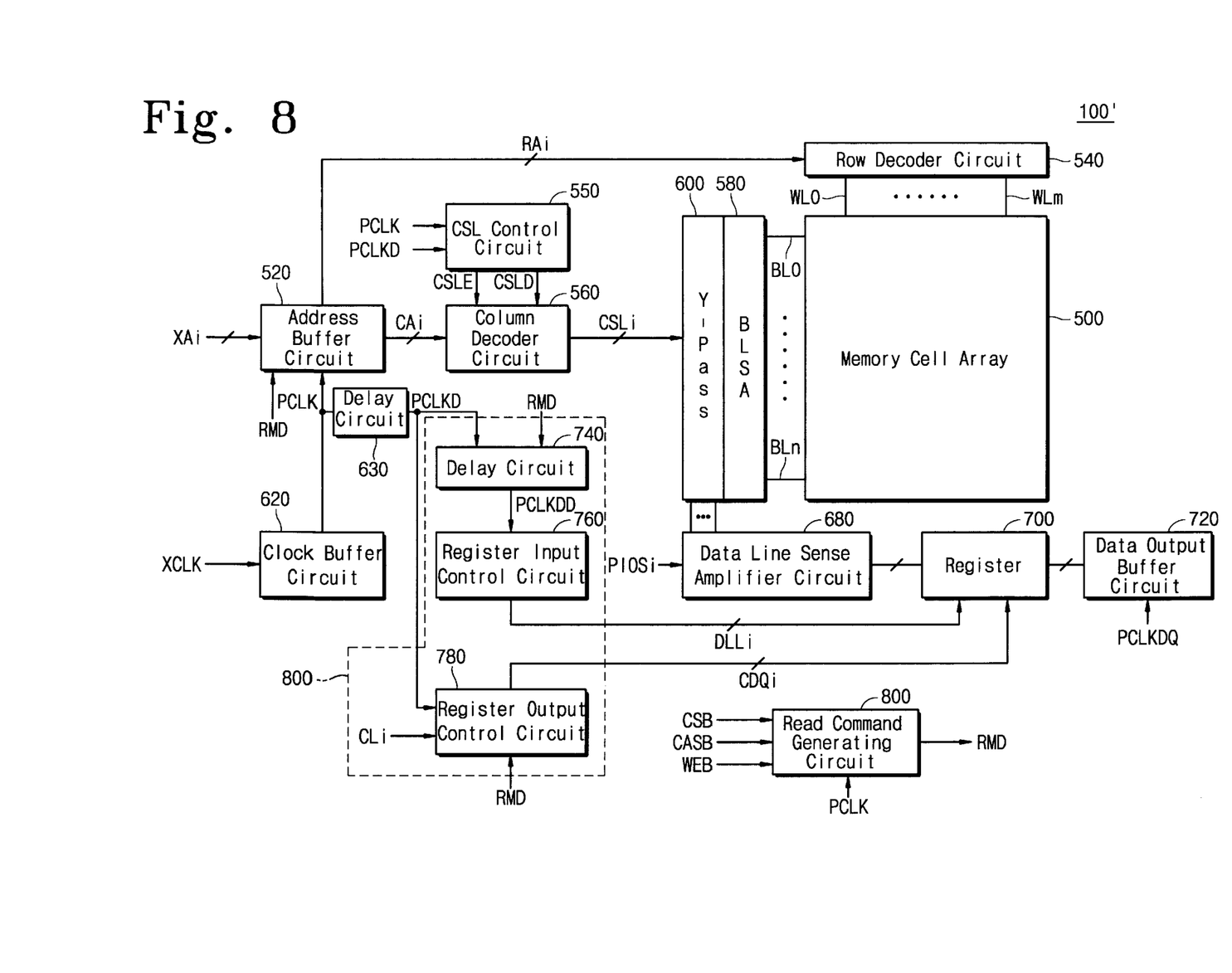
FIG. 8 is a block diagram of a memory device according to a second embodiment of the present invention.

Referring to FIGS. 5 and 8, a register input control circuit 360/800 is provided which generates register input and output control signals DLLi and CDQi for controlling data input to and output from data register 280/700, respectively. The register control circuit 360/800 sequentially generates the register input control signals DLLi so that data read out (sensed/amplified) in synchronization with a first clock cycle is stored in the register 280/700 in synchronization with a second subsequent clock cycle. If necessary, lower operating frequencies can also be used for single-state devices in cases where delay skews caused by process variations are extreme.

A block diagram of a synchronous semiconductor memory device 100 according to a first preferred embodiment of the present invention is illustrated in FIG. 5. Referring to FIG. 5, a memory cell array 110 of DRAM cells is provided in the device 100. A plurality of word lines WLi (i=0–m) extend across the memory cell array 110, and a plurality of bit lines BLj (j=0–n) extend in a perpendicular direction relative to the word lines. As is well known in the art, each DRAM cell may store data as a logic "1" or "0" signal and have a storage capacitor and a switching or access transistor. Each of the word lines WLi is connected to a row decoder circuit 140. The row decoder 140 selects one of the word lines WL0 to WLm in accordance with row address signals RAi provided by an address buffer circuit 120. The row decoder circuit 140 may comprise a pre row decoder, a row decoder and a bank selector (in the event the memory cell array 110 has a bank structure, etc.). A refresh control circuit (not shown) comprising a refresh timer, a refresh controller and a refresh counter may be provided within the device 100 so as to support a refresh operation.

The bit lines BL0 to BLn are coupled to a bit line sense amplifier circuit 180, which senses and amplifies a potential difference between each bit line pair. A column decoder circuit 160 decodes column address signals CAi supplied through the address buffer circuit 120, and then activates one of the column selection signals CSLi. The column decoder circuit 160 is responsive to a column selection line disable signal CSLD and disables the column selection signal in response thereto. A column pass gate circuit (or a column selector) 200 connects at least one of the bit line pairs with a corresponding data line pair in response to an activated column selection signal.

A CSL control circuit 240 receives an internal clock signal PCLK from a clock buffer circuit 220 and a delayed clock signal PCLKD from a delay circuit 230, and then generates the CSL disable signal CSLD and the CSL enable signal CSLE in response to signal CAi_BANK from the address buffer circuit 120 when a read operation is performed. A read command generating circuit 380 generates a read command signal RMD in response to signals CSB and CASB of a low level and a signal WEB of a high level at a rising edge of a clock signal PCLK or XCLK. The CSL disable signal CSLD is synchronized with the rising edge of the clock signal PCLK and the CSL enable signal CSLE is also synchronized with the rising edge of the clock signal PCLK. Thus, according to a preferred aspect of the present invention, the column decoder circuit 160 makes an activated column selection signal CSL corresponding to (i−1)th clock cycle become inactivated when the CSL disable signal CSLD is clocked with the rising edge of the clock signal PCLK at an ith clock cycle. The column decoder circuit 160 also causes a column selection signal CSLi corresponding to an ith clock cycle to become activated by use of a CSL enable signal CSLE synchronized with the rising edge of the delayed clock signal PCLKD in the ith clock cycle.

Read data (sensed and amplified data) that is transferred in sequence to the data line pair is again sensed and amplified through a data line sense amplifier circuit 260 when a signal PIOSi is activated. A register 280 temporarily stores the data from the data line sense amplifier circuit 260 in response to register input control signals DLLi. These control signals are sequentially issued from the register control circuit 360. The register 280 is configured similarly to the register 26 of FIG. 2.

The register control circuit 360 comprises a register input control circuit 320 and a register output control circuit 340. The register input control circuit 320 generates the register input control signals DLLi, in synchronization with a delayed clock signal PCLKD of an ith clock cycle. The register input control signals DLLi are preferably generated so that read data corresponding to the (i−1)th clock cycle can be latched in a corresponding latch circuit in synchronization with the external clock signal XCLK of the ith clock cycle. The register output control circuit 340 responds to the read command signal RMD, signal CLi and the delayed clock signal PCLKD, and then produces register output control signals CDQi in sequence. These output control signals enable the sequential transfer of data from the register 280 to the output buffer 300.

Figure 6:
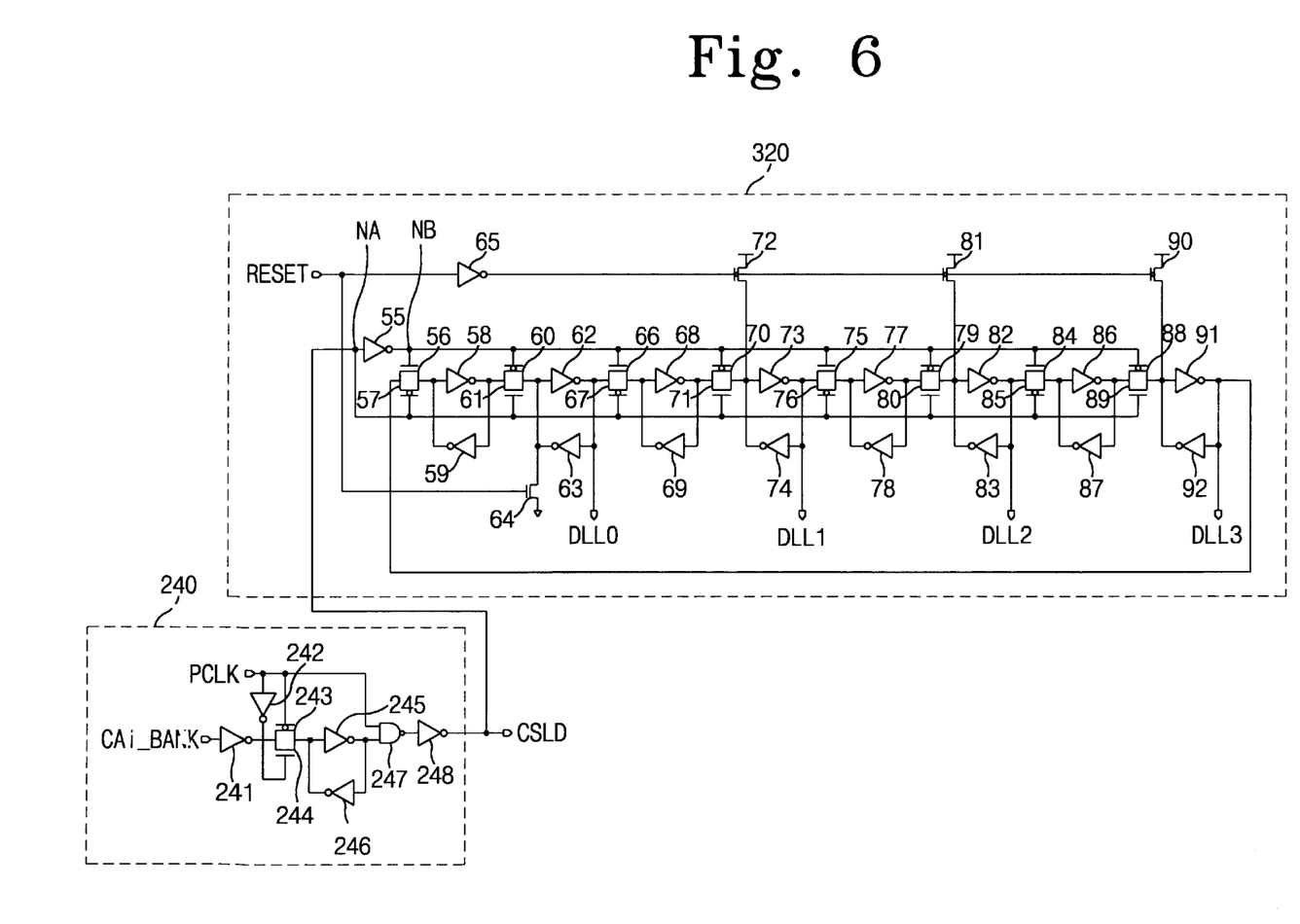
FIG. 6 is an electrical schematic of a register input control circuit and CSL control circuit, according to the embodiment of FIG. 5.
Figure 7:
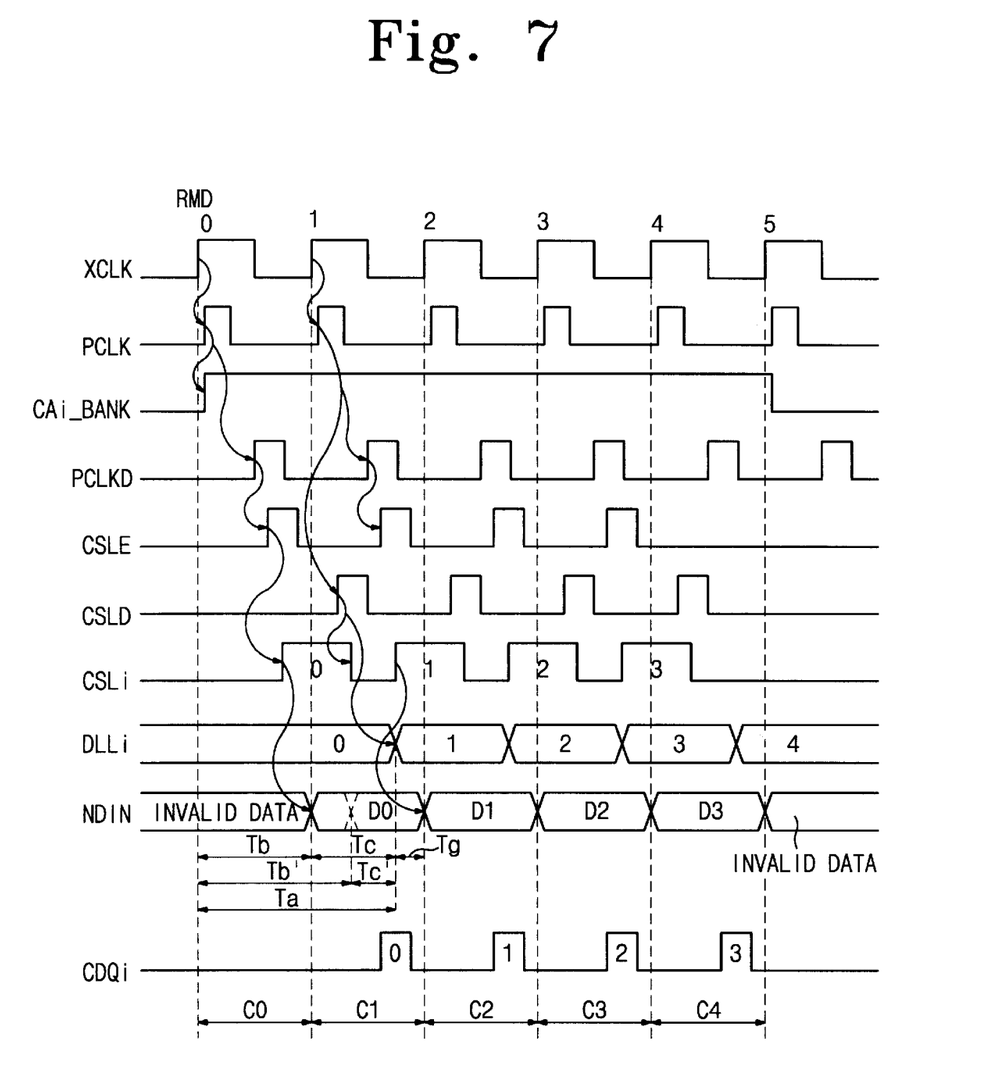
FIG. 7 is a timing diagram which illustrates operation of the memory device of FIG. 5.

A CSLD generator within the CSL control circuit 240 and the register input control circuit 320 according to the first embodiment of the present invention are illustrated in FIG. 6. The CSLD generator is comprised of five inverters 241, 242, 245, 246 and 248, PMOS and NMOS transistors 243 and 244, and a NAND gate 247. When the signal CAi_BANK is held at a logic 0 level while PCLK=0, the CSL disable signal CSLD is held low regardless of subsequent changes in the state of the internal clock signal PCLK. On the contrary, when the signal CAi_BANK is maintained high, the signal CSLD follows the internal clock signal PCLK in cycles C1, C2, C3 and C4, as illustrated by FIG. 7. As a result, the register input control circuit 320 receives as its input signal the CSL disable signal CSLD during clock cycle C1. The CSL disable signal CSLD then operates to terminate a read operation initiated in clock cycle C0 by driving the column select signal CSLi to a logic 0 level. Operations performed by the register input control circuit 320 are similar to those described above with respect to the control circuit 28 of FIG. 3.

A timing diagram for describing a burst read operation according to the first embodiment of the present invention is illustrated in FIG. 7. Prior to clock cycle C0, a word line, which is designated according to row address signals RAi (provided through the address buffer 120) is selected by the row decoder circuit 140. Data in each memory cell connected to the selected word line is sensed and amplified by the bit line sense amplifier circuit 180. During the clock cycle C0, initial address signals CAi (column address signals) for the burst read operation are supplied to the column decoder circuit 160 through the address buffer 120 in synchronization with a rising edge of an external clock signal XCLK. At the same time, the read command signal RMD is issued from the read command generating circuit 380. The column decoder circuit 160 produces a column selection signal, for example, CSL0, corresponding to the column address signals CAi in response to the CSL enable signal CSLE from the CSL control circuit 240. At least one pair of bit lines is connected with corresponding data lines through the column pass gate circuit 200. The data line sense amplifier circuit 260 senses and amplifies data transferred onto the data lines when the signal PIOSi is activated.

During the beginning of the next clock cycle C1, the register input control signal DLL0 is held at a logic 1 level and the switch circuit SW1 of the register 280 is maintained in a switched-on state. The register 280 may be constructed to perform the same function as the register 26 of FIG. 2. This enables data (corresponding to the initial address signals) from the data line sense amplifier circuit 260 to be latched into the latch circuit L1, as illustrated by FIG. 2. The data is not latched into the other latch circuits L2–L4 because the other register input control signals DLL1 to DLL3 are inactivated low. As illustrated by FIGS. 6–7, the register input control circuit 320 responds to the CSL disable signal CSLD, and then forces the register input control signal DLL0 to be inactivated low in synchronization with the rising edge XCLK of the clock cycle C1 (that is, the register input control signal DLL0 is synchronized with the external clock signal XCLK in cycle C1, instead of clock cycle C0). This makes the switch circuit SW1 of FIG. 2 open and the switch circuit SW2 close in preparation for new data.

As further illustrated by FIG. 7, the column selection signal CSL0 enabled during the previous clock cycle C0 is disabled in synchronization with the rising edge of the external clock signal XCLK during cycle C1. The internal clock signal PCLK, and a column selection signal CSL1 corresponding to the next burst address (next column address signals) produced from the burst counter (not shown) is activated in synchronization with the delayed clock signal PCLKD during the clock cycle C1. Likewise, at least one pair of bit lines is electrically connected with corresponding data lines (i.e., a pair of data lines) through the column pass gate circuit 200. The data line sense amplifier circuit 260 senses and amplifies the new data transferred onto the data lines.

At clock cycle C2, since the register input control signal DLL1 enabled during the previous clock cycle C1 continues to be maintained high, the switch circuit SW2 of the register 280 remains in a switched-on state. This enables data (corresponding to the burst address signals) from the data line sense amplifier circuit 260 to become latched in the latch circuit L2. The register input control circuit 320 forces the register input control signal DLL1 to then become inactivated low in synchronization with the rising edge of the clock cycle C2, and a next register input control signal DLL2 to become activated high at the same time, as shown in FIG. 7. Namely, the register input control signal DLL1 is synchronized with the external clock signal XCLK2 corresponding to the clock cycle C2 (delayed by one cycle on the basis of the previous clock cycle C1).

The column selection signal CSLL activated at the previous clock cycle C1 is inactivated in the same manner as described above. A column selection signal CSL2 corresponding to burst address signals (next column address signals) issued from the burst counter is enabled in synchronization with the rising edge of the external clock signal XCLK2. Operations associated with following clock cycles C3 and C4 are equal to those of the previous clock cycles C1 and C2, and a description thereof is thus omitted. As a result, sequentially read out data in accordance with the aforementioned burst read operation is stored in the register 280 in order. As set forth above, since the CASB latency is 2, the register output control circuit 340 responds to signal CLi, and sequentially generates register output control signals CDQ0 to CDQ3 synchronized with the external clock signal XCLK, wherein the signals CDQ0 to CDQ3 are not issued from the clock cycle C0, but from the clock cycle C1, as shown in FIG. 7. This enables data stored in the register 280 to be transferred to the data output buffer circuit 300 through switch circuits SW5 to SW8, which are switched on in sequence according to the signals CDQ0 to CDQ3.

As described above, each register input control signal (e.g., DLL0) is disabled by means of a column selection line disable signal CSLD, that is synchronized with a clock signal (e.g., XCLK) of a next clock cycle (e.g., C1). Accordingly, even under worst case processing conditions, a sufficiently long data latch margin To can be achieved. In other words, even though a delay time caused on a data path of the signal DLLi may equal that of the prior art device, illustrated by FIG. 1, the data and signal paths are synchronized with different clock cycles C0 and C1, respectively, so that an increased data latch margin can be achieved. Moreover, even when the period of time Tc is decreased significantly because of process variations, a sufficient margin may still be achieved by lowering the operating frequency of the clock.

A block diagram of a synchronous DRAM device 100' with an wave pipeline scheme according to a second preferred embodiment of the present invention is shown in FIG. 8. The device 100' of the second embodiment differs from the first embodiment in that a register input control circuit 760 sequentially generates register input control signals DLLi which are synchronized with a clock signal PCLKDD delayed by one cycle in accordance with a read command signal RMD during a read operation. In other words, the register input control circuit 760 generates a register input control signal DLLi synchronized with a clock signal of i-th clock cycle from a delay circuit 740 so that read data corresponding to (i–1)th clock cycle is latched in a register 700 in synchronization with the i-th clock cycle. A delay circuit 630 delays the clock signal PCLK, while a delay circuit 740 produces a clock signal PCLKDD delayed by one clock cycle. In FIG. 8, elements that are the same as those of FIG. 5 are labeled with the same reference numerals, and description thereof is thus omitted.

Figure 9:
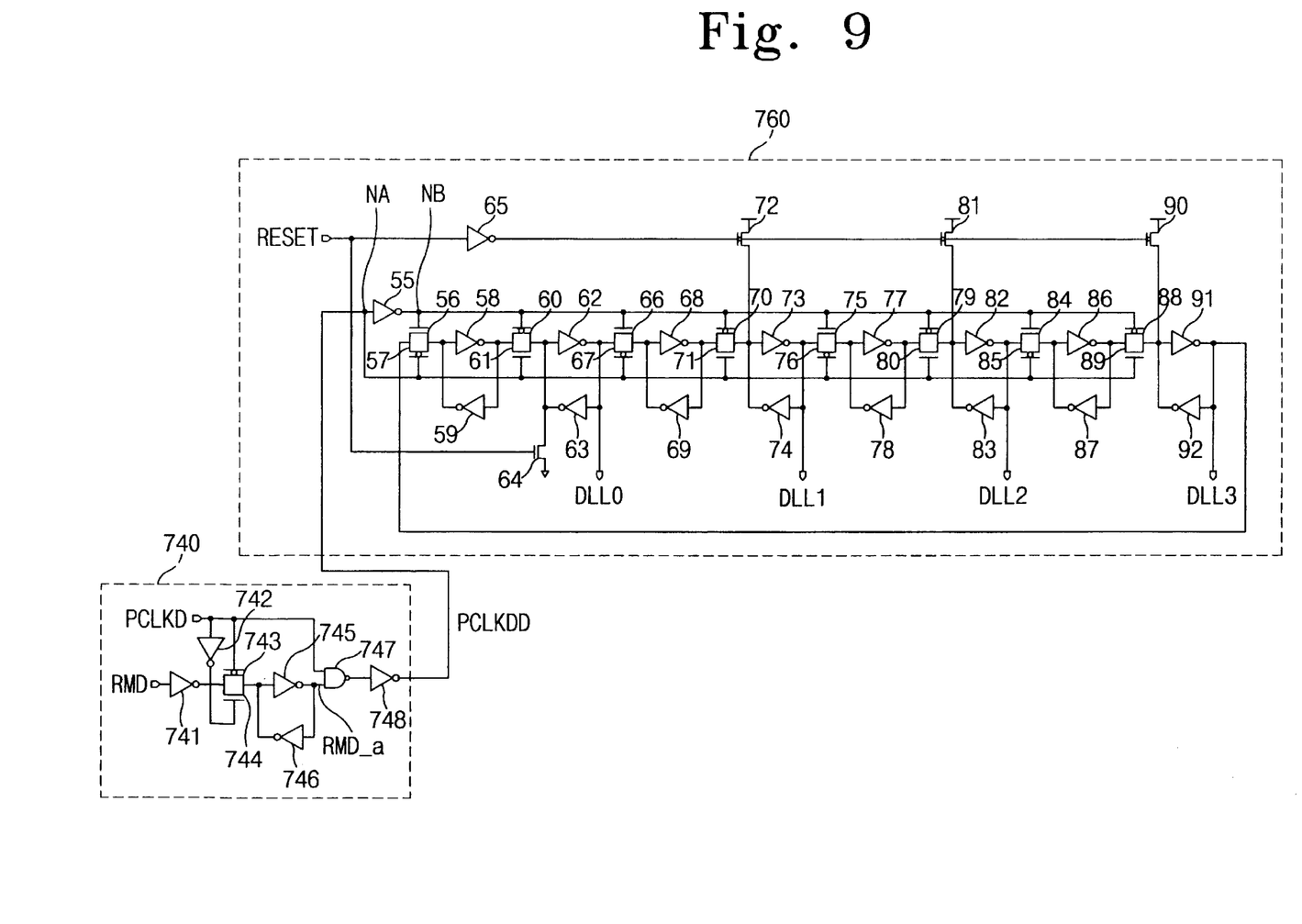
FIG. 9 is an electrical schematic of a register input control circuit and delay circuit, according to the embodiment of FIG. 8.

Referring to FIG. 9, a delay circuit 740 and a register input control circuit 760 (within the register control circuit 800 of FIG. 8) are illustrated in detail. The delay circuit 740 is composed of five inverters 741, 742, 745, 746 and 748, PMOS and NMOS transistors 743 and 744, and a NAND gate 747 connected as shown in FIG. 9. When the signal RMD from the read command generating circuit 800 is held low, an output signal PCLKDD of the delay circuit 740 continues to be held low because an input signal RMD_a of the NAND gate 747 is low. On the contrary, when the read command signal RMD is maintained high, the signal PCLKDD becomes a delayed version of the clock signal PCLKD. As a result, the register input control circuit 760 receives at its input the clock signal PCLKDD delayed by one clock cycle relative to the preceding clock cycle during which the read command RMD transitions from low to high. The register input control circuit 760 is the same as the register input control circuit 320 of FIG. 5.

Figure 10:
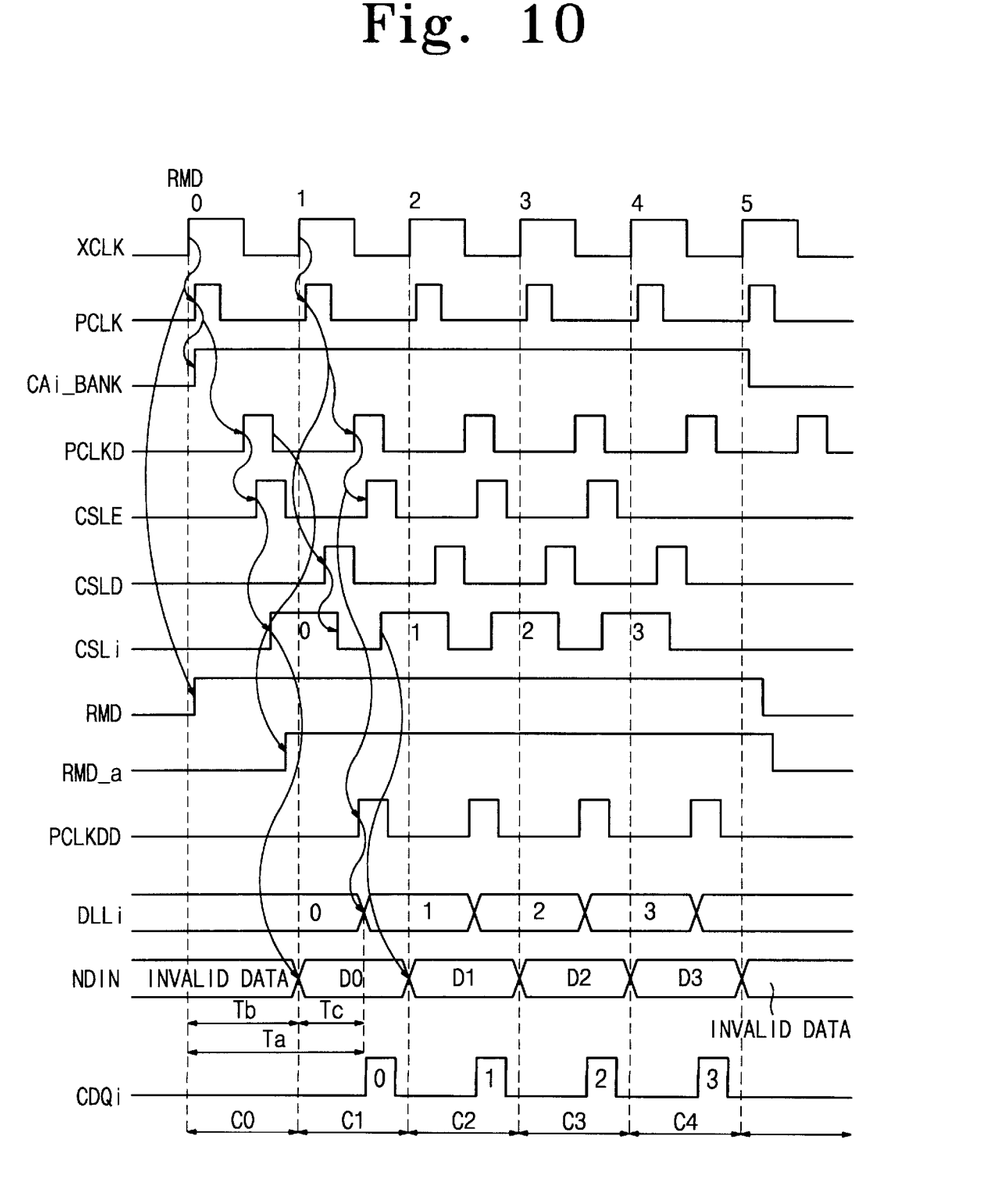
FIG. 10 is a timing diagram which illustrates operation of the memory device of FIG. 8.

A timing diagram for describing a burst read operation according to the second embodiment of the present invention is illustrated in FIG. 10. As mentioned above, the DRAM device 100' of FIG. 8 has a CASB latency of 2 and a burst length of 4. Prior to clock cycle C0, word line WL0 is selected by the row decoder circuit 540 which is designated according to row address signals RAi provided through the address buffer 520. Data in each memory cell connected to the selected word line WL0 is sensed and amplified by the bit line sense amplifier circuit 580. During the clock cycle C0, initial column address signals CAi for the burst read operation are supplied to the column decoder circuit 560 through the address buffer 520 in synchronization with a rising edge of an external clock signal XCLK0. At the same time, the read command signal RMD is issued from the read command generating circuit 800. The column decoder circuit 560 produces a column selection signal (e.g., CLS0) corresponding to the column address signals CAi in response to the CSL enable signal CSLE from the CSL control circuit 550. At least one pair of bit lines is connected with corresponding data lines (i.e., a pair of data lines) through the column pass gate circuit 600. The data line sense amplifier circuit 680 then senses and amplifies data transferred onto the data lines when the signal PIOSi is activated.

At a following clock cycle C1, since the register input control signal DLL0 is kept up high the switch circuit SW1 of the register 700 is maintained at a switched-on state. This enables data (corresponding to the initial address signals) from the data line sense amplifier circuit 680 to be latched in the latch circuit L1 of FIG. 2. The register input control circuit 760 forces the register input control signal DLL0 to be inactivated low and the register input control signal DLL1 to be activated high in synchronization with the rising edge of a delayed clock signal PCLKDD (that is, XCLK1) by one clock cycle through the delay circuit 740. Accordingly, the switch SW1 of FIG. 2 is switched off and the switch circuit SW2 thereof is switched on.

As illustrated by FIG. 10, the column selection signal CSL0 enabled at the previous clock cycle C0 is disabled in synchronization with the rising edge of the external clock signal XCLK1, that is, the clock signal PCLK, and a column selection signal CSL1 corresponding to the next burst address signals (next column address signals) produced from the burst counter (not shown) is activated in synchronization with the rising edge of the clock signal PCLKD corresponding to the external clock signal XCLK1. Likewise, at least one pair of bit lines is electrically connected with corresponding data lines through the column pass gate circuit 600. Successively, the data line sense amplifier circuit 680 senses and amplifies data transferred onto the data lines.

In a next clock cycle C2, since the register input control signal DLL1 enabled at the previous clock cycle C1 continues to be maintained high, the switch circuit SW2 of the register 700 remains in a switched-on state. This enables data (corresponding to the burst address signals) from the data line sense amplifier circuit 680 to become latched in the latch circuit L2. The register input control circuit 760 then forces the register input control signal DLL1 to become inactivated low and a next register input control signal DLL2 to become activated high in synchronization with the rising edge of the clock signal XCLK2.

The column selection signal CSL1 activated at the previous clock cycle C1 is inactivated in synchronization with the rising edge of the external clock signal XCLK2, a column selection signal CSL2 corresponding to burst address signals (next column address signals) issued from the burst counter is enabled in synchronization with the rising edge of the clock signal PCLKD clocked to the external clock signal XCLK2. Operations associated with following clock cycles C3 and C4 are similar to those of the previous clock cycles C1 and C2, and a description thereof is thus omitted. As a result, sequentially read out data in accordance with the aforementioned burst read operation is stored in the register 700 in order. As set forth above, since the CASB latency is 2, the register output control circuit 780 responds to the signal CLi, and sequentially generates register output control signals CDQ0 to CDQ3 synchronized with the external clock signal XCLK, wherein the signals CDQ0 to CDQ3 are not issued from the clock cycle C0, but from the clock cycle C1, as shown in FIG. 10. This enables data stored in the register 700 to be transferred to the data output buffer circuit 720 through switch circuits SW5 to SW8. These circuits are switched on in sequence according to the signals CDQ0 to CDQ3 thus issued. Accordingly, because a data path for transferring read data is synchronized by a clock signal of an i-th clock cycle and a signal path for delivering register input control signals is synchronized with the clock signal of an (i+1)th clock cycle delayed by one clock cycle, a sufficiently large data latch margin can be achieved.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. An integrated circuit memory device, comprising:
   a memory cell array; and
   means, electrically coupled to said memory cell array, for latching data accessed in said memory cell array during an ith cycle of an internal clock signal in-sync with an i+1th cycle of the internal clock signal, where "i" is an integer.

2. The memory device of claim 1, wherein said latching means comprises:
   a register that is responsive to a plurality of register input control signals; and
   a pipelined register input control circuit that generates the plurality of register input control signals in response to a column select disable signal.

3. The memory device of claim 2, wherein said latching means further comprises:
   a column select control circuit that latches a value of a bank select signal when the internal clock signal is in a first logic state and passes the latched value of the bank select signal as the column select disable signal upon transition of the internal clock signal from the first logic state to a second logic state.

4. The memory device of claim 3, wherein each transition of the column select disable signal from the first logic state to the second logic state causes a sequential shift in a state of the plurality of register input control signals.

5. The memory device of claim 1, wherein said latching means comprises:
   a register that is responsive to a plurality of register input control signals; and
   a pipelined register input control circuit that generates the plurality of register input control signals in response to a dual-delayed clock signal.

6. The memory device of claim 5, wherein said latching means further comprises:
   a delay circuit that latches a value of a read command signal when a delayed version of the internal clock signal is in a first logic state and passes the latched value of the read command signal as the dual-delayed clock signal upon transition of the delayed version of the internal clock signal from the first logic state to a second logic state.

7. The memory device of claim 6, wherein each transition of the dual-delayed version of the clock signal from the first logic state to the second logic state causes a sequential shift in a state of the plurality of register input control signals.

8. An integrated circuit memory device, comprising:
   a data output register that is responsive to i through j consecutive register input control signals and i through j register output control signals, where "i" and "j" are integers;
   a column decoder circuit that generates i through j column select signals in sequence during respective i through j consecutive periods of an internal clock signal;
   means, responsive to the i through j column select signals, for providing read data to said data output register during i+α through j+α consecutive periods of the internal clock signal, where α is a positive integer; and
   a pipelined register input control circuit that generates the i through j consecutive register input control signals in-sync with the internal clock signal during the i+α through j+α consecutive periods thereof.

9. The memory device of claim 8, wherein said pipelined register input control circuit is responsive to a column select disable signal.

10. The memory device of claim 8, wherein said pipelined register input control circuit is responsive to a dual-delayed version of the internal clock signal.

11. The memory device of claim 9, further comprising a column select control circuit that latches a value of a bank select signal when the internal clock signal is in a first logic state and passes the latched value of the bank select signal as the column select disable signal upon transition of the internal clock signal from the first logic state to a second logic state.

12. The memory device of claim 10, further comprising a delay circuit that latches a value of a read command signal when a delayed version of the internal clock signal is in a first logic state and passes the latched value of the read command signal as the dual-delayed version of the internal clock signal upon transition of the delayed version of the internal clock signal from the first logic state to a second logic state.

13. A synchronous semiconductor memory device comprises:
   a memory cell array for storing data;
   a read circuit for sequentially reading out data in the memory cell array in synchronization with a clock signal during a read operation;
   a register having a plurality of latch circuits connected in parallel to each other, for sequentially storing the data from the read circuit in corresponding latch circuits in response to register input control signals during the read operation;
   a register control circuit for generating the register input control signals in synchronization with the clock signal during the read operation, the register control circuit generating a register input control signal in synchronization with the clock signal of i-th clock cycle in order that read data corresponding to (i−1)th clock cycle is stored in a corresponding latch circuit in synchronization with the clock signal of i-th clock cycle, where "i" is an integer.

14. The synchronous semiconductor memory device according to claim 13, wherein the register control circuit generates register output control signals in sequence in response to CASB latency and read command signals and the clock signal, wherein data stored in the register are sequentially outputted into the exterior by means of the register output control signals.

15. A synchronous semiconductor memory device comprising:
   an array of a plurality of word lines, a plurality of bit lines, and a plurality of memory cells each arranged in intersections of the word lines and the bit lines, the bit lines being composed of a plurality of bit line pairs;
   a row selection circuit for selecting one from the word lines during a read operation;
   a column selection circuit for selecting a pair of bit lines from the bit line pairs in response to a column selection line enable signal in synchronization with the clock signal of i-th clock cycle, and for making a bit line pair selected at (i−1)th clock cycle inactivated in response to a column selection line disable signal in synchronization with the clock signal of i-th clock cycle, where "i" is an integer;

a column selection line control circuit for producing the column selection line enable and disable signals in response to the clock signal at every clock cycle during the read operation;

a sense amplifier circuit for sequentially sensing data corresponding to bit line pairs selected in order by the column selection circuit among the data stored in memory cells associated with the selected word line;

a register having a plurality of latch circuits connected in parallel with each other, for successively storing the read data from the read circuit in corresponding latch circuits in response to register input control signals during the read operation; and a register input control circuit for sequentially generating the register input control signals in synchronization with the clock signal during the read operation, wherein the register input control circuit produces a register input control signal in synchronization with the clock signal of i-th clock cycle in order that read data corresponding to (i−1)th clock cycle is stored in a corresponding latch circuit in synchronization with the clock signal of i-th clock cycle.

16. The synchronous semiconductor memory device according to claim 15, further comprising: a register output control circuit for generating register output control signals in sequence in response to a CASB latency signal, a read command signal and the clock signal, wherein data stored in the register are successively outputted into the exterior by means of the register output control signals.

17. A method of controlling a data path of a synchronous semiconductor memory device with a wave pipeline scheme and comprising a memory cell array storing data, the method comprising the steps of:

reading out data from the memory cell array in synchronization with an i-th cycle of a clock signal during a read operation, where "i" is an integer; and storing read data synchronized with the i-th cycle of the clock signal in a register on the data path in response to a register input control signal that is synchronized with the (i+1)th cycle of the clock signal.

* * * * *

UNITED STATES PATENT AND TRADEMARK OFFICE
CERTIFICATE OF CORRECTION

PATENT NO. : 6,154,417
DATED : November 28, 2000
INVENTOR(S) : Nam-Jong Kim et al.

It is certified that error appears in the above-identified patent and that said Letters Patent is hereby corrected as shown below:

[56]   References Cited

U.S. Patent Documents
5,703,815      12/1997      Kuhara et al.      365/194

Other Documents
Wong et al., A Bipolar Population Counter Using Wave Pipelining to Achieve 2.5x Normal Clock Frequency, 1992 IEEE International Solid-State Circuits Conference, Session 3/High-Performance Circuits/Paper WP3.6, 1992, pp. 56-57.

Yoo et al., A 150 MHz 8-Banks 256M Synchronous DRAM With Pipelining Methods, 1995 IEEE International Solid-State Circuits Conference, Session 14/DRAM/Paper FA 14.4, 1995, pp. 250-251

Signed and Sealed this

Twenty-fifth Day of September, 2001

*Attest:*

Nicholas P. Godici

NICHOLAS P. GODICI
*Attesting Officer*   Acting Director of the United States Patent and Trademark Office